United States Patent
Liao et al.

(10) Patent No.: US 9,041,841 B2
(45) Date of Patent: May 26, 2015

(54) IMAGE SENSOR HAVING ENHANCED BACKSIDE ILLUMINATION QUANTUM EFFICIENCY

(75) Inventors: Yin-Kai Liao, Taipei (TW); Han-Chi Liu, Dahu Shiang (TW); Yuan-Hung Liu, Hsin-Chu (TW); Dun-Nian Yaung, Taipei (TW); Jen-Cheng Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 880 days.

(21) Appl. No.: 12/557,154

(22) Filed: Sep. 10, 2009

(65) Prior Publication Data

US 2010/0091163 A1 Apr. 15, 2010

Related U.S. Application Data

(60) Provisional application No. 61/104,630, filed on Oct. 10, 2008.

(51) Int. Cl.
  *H04N 3/14* (2006.01)
  *H04N 5/335* (2011.01)
  *H01L 27/146* (2006.01)

(52) U.S. Cl.
  CPC .......... *H01L 27/14603* (2013.01); *H04N 3/155* (2013.01)

(58) Field of Classification Search
  CPC ...................................................... H04N 3/155

USPC ............................................ 348/308; 257/292
See application file for complete search history.

(56) References Cited

U.S. PATENT DOCUMENTS

| | | | |
|---|---|---|---|
| 6,706,550 B2 | 3/2004 | Lee et al. | |
| 6,900,507 B1* | 5/2005 | Hong | 257/413 |
| 2003/0025160 A1* | 2/2003 | Suzuki et al. | 257/347 |
| 2003/0211746 A1* | 11/2003 | Chen et al. | 438/700 |
| 2006/0118795 A1* | 6/2006 | Araki | 257/83 |
| 2006/0125007 A1* | 6/2006 | Rhodes | 257/346 |
| 2006/0197171 A1* | 9/2006 | Zhang et al. | 257/433 |
| 2007/0117254 A1* | 5/2007 | Pain | 438/75 |
| 2008/0017946 A1* | 1/2008 | Cazaux et al. | 257/447 |
| 2008/0179640 A1* | 7/2008 | Chuang et al. | 257/292 |
| 2009/0059144 A1* | 3/2009 | Lin et al. | 349/119 |
| 2009/0200586 A1* | 8/2009 | Mao et al. | 257/292 |
| 2011/0176328 A1* | 7/2011 | Anandan et al. | 362/606 |

* cited by examiner

*Primary Examiner* — Roberto Velez
*Assistant Examiner* — Cynthia Segura
(74) *Attorney, Agent, or Firm* — Slater & Matsil, L.L.P

(57) ABSTRACT

A system and method for image sensing is disclosed. An embodiment comprises a substrate with a pixel region and a logic region. A first resist protect oxide (RPO) is formed over the pixel region, but not over the logic region. Silicide contacts are formed on the top of active devices formed in the pixel region, but not on the surface of the substrate in the pixel region, and silicide contacts are formed both on the top of active devices and on the surface of the substrate in the logic region. A second RPO is formed over the pixel region and the logic region, and a contact etch stop layer is formed over the second RPO. These layers help to reflect light back to the image sensor when light impinges the sensor from the backside of the substrate, and also helps prevent damage that occurs from overetching.

20 Claims, 8 Drawing Sheets

IMAGE SENSOR HAVING ENHANCED BACKSIDE ILLUMINATION QUANTUM EFFICIENCY

This application claims the benefit of U.S. Provisional Patent Application Ser. No. 61/104,630, filed on Oct. 10, 2008, and entitled "Image Sensor Having Enhanced Backside Illumination Quantum Efficiency," which application is incorporated herein by reference.

TECHNICAL FIELD

The present invention relates generally to an image sensor and a method of manufacturing same and, more particularly, to an image sensor having a dielectric reflector that enhances backside illumination efficiency and a method of manufacturing same that reduces the deleterious effects of over-etching dielectric layers.

BACKGROUND

Complementary metal oxide semiconductor (CMOS) image sensors are gaining in popularity over traditional charged-coupled devices (CCDs) due to certain advantages inherent in the CMOS image sensors. In particular, CMOS image sensors typically require lower voltages, consume less power, enable random access to image data, may be fabricated with compatible CMOS processes, and enable integrated single-chip cameras.

CMOS image sensors utilize light-sensitive CMOS circuitry to convert light energy into electrical energy. The light-sensitive CMOS circuitry typically comprises a photodiode formed in a silicon substrate. As the photodiode is exposed to light, an electrical charge is induced in the photodiode. The photodiode is typically coupled to a MOS switching transistor, which is used to sample the charge of the photodiode. Colors may be determined by placing filters over the light-sensitive CMOS circuitry.

The light received by pixels of the CMOS image sensor is often based on the three primary colors: red, green, and blue (R, G, B), and additional colors can be identified and/or created with various combinations and intensities (e.g., when red and green overlap they form yellow). Pixel sensitivity for receiving the incident light, however, is lowered with the trend of size reduction of pixels of the CMOS image sensor and cross-talk is caused between different pixels against incident light, especially against incident light with a long wavelength such as the red light (wavelength of about 650 nm), thereby degrading the overall performance of pixels of the CMOS image sensor.

As is known, image sensors can be designed to be illuminated from a front surface or from a back surface. Backside illumination image sensors provide an advantageous feature wherein the need to carefully place and route metallization features so as not to interfere with the optical path is eliminated, because the illumination comes from the backside of the wafer, whereas metallization is formed on the front side of the wafer. Additionally, the overall optical path, i.e., the optical distance from the focusing lens of the sensor to the actual light receiving surface of the sensor itself is typically reduced with backside illumination, relative to front-side illumination because the light need not travel through the metallization and inter-metal dielectric layers.

A disadvantage of conventional backside illumination image sensors is that some of the incident light may pass through the sensor and into the overlying dielectric layer. One way to reduce this unfavorable result would be to increase the thickness and/or reflectivity of the overlying dielectric layer. This may result, however, in defects arising during the manufacturing process. FIG. 1 illustrates two such potential defects, which may arise in a logic area 101 of an integrated circuit in which is formed an image sensor. While many details of an actual logic device are omitted from FIG. 1 for clarity, a substrate 100 is shown having shallow trench isolation features 104 formed therein. A top surface of the substrate 100 has been silicided to form a silicide layer 102. Conventionally, the silicide layer 102 will be formed using a self-aligned process, or so-called salicide process. Contact etch stop layer 106 (CESL) is formed atop the silicide layer 102 and an inter-level dielectric (ILD) 108 is formed atop the CESL 106. Contact 110 is formed by etching an opening through the ILD 108 and through the CESL 106 in order to expose, e.g., a portion of the silicide layer 102. A conductor is then formed within the opening to form contact 110. The function and manufacture of these elements is well known in the art.

In an effort to increase the reflectivity of the image sensor (which are manufactured concurrently with logic devices), the thickness of the dielectric layers (e.g., silicon oxide layer 105, ILD 108 and/or CESL 106) over, for example, a photosensitive diode 107 and transfer transistor 109 have been increased. However, such an increase in thickness also results in less process control of an etching process used to form contact openings. As a result, over-etching may occur, such as the over-etching illustrated generally at region 112. Such over-etching can have deleterious effects, such as causing unacceptable levels of leakage current, cross-talk between neighboring devices, and potentially could cause the resulting device to not perform as desired or to not perform at all.

FIG. 1 also illustrates another potential adverse consequence of over-etching in the logic region 101. As illustrated in FIG. 1, a gate stack 114 may be formed on substrate 100 and sidewall spacers 116 formed on gate stack 114, as is known. However, while the contact openings for contact 110 and contact 111 are typically done simultaneously, the etching cannot be stopped until the contact openings for contact 110 extends through the silicon oxide layer 105. This may cause the etching of the contact opening for contact 111 to overetch the sidewall spacers 116 (shown generally at region 118) and can result in undesired consequences, such as a potential short circuit of the contact 111 to the underlying substrate 100. If over-etching did not occur, sidewall spacer 116 and/or CESL 106 would have prevented the short circuit illustrated generally at 118.

Hence, what is needed is an improved image sensor device that provides for increased backside illumination quantum efficiency while avoiding the risks associated with over-etching of overlying dielectric layers.

SUMMARY OF THE INVENTION

These and other problems are generally solved or circumvented, and technical advantages are generally achieved, by embodiments of the present invention which form an image sensor with an enhanced quantum efficiency.

In accordance with an embodiment of the present invention, a backside illuminated image sensor comprises a substrate with a pixel region, a logic region, a first side and second side opposite the first side. A first active device is located in the pixel region, wherein the first active device is at least partially located on the first side of the substrate and wherein the first active device comprises a photosensitive element positioned to receive light from the second side of the substrate. A second active device is located in the logic region at least partially located on the first side of the substrate. A first protective layer is located over the first side of the substrate in the pixel region while the logic region is free from the first protective layer. A second protective layer is located over the logic region and the first protective layer in the pixel region, and a contact etch stop layer is located over the second protective layer.

In accordance with another embodiment of the present invention, an image sensor comprises a substrate with a pixel region and a logic region. A first device is located at least partially on a first surface of the substrate in the pixel region, wherein the first device is located to receive light from a second surface of the substrate opposite the first surface. A second device is located in the logic region o the first surface of the substrate. A first metal-containing layer is located on the first device, and a second metal-containing layer is located on a major surface of the substrate in the logic region. The major surface of the substrate adjacent to the first device is free of metal. A first protective layer is located over the pixel region without covering the first metal, while the logic region is free from the first protective layer. A second protective layer is located over both the pixel region and the logic region, and a contact etch stop layer is located over the second protective layer.

In accordance with yet another embodiment of the present invention, a method for manufacturing a backside illuminated image sensor comprises providing a substrate with a first region and a second region. A first device is formed in the first region, the first device being located on a first surface of the substrate and positioned to receive light from a second surface of the substrate opposite the first surface. A second device is formed in the second region. A first protective layer is formed so as to be located over the first region without being located over the second region. A top surface of the first device is exposed without exposing a major surface of the substrate in the first region. A first silicide region is formed on the top surface of the first device, and a second silicide region is formed on the major surface of the substrate in the second region. A second protective layer is formed over the first region and the second region, and a contact etch stop layer is formed over the second protective layer.

An advantage of an embodiment of the present invention is an increase in the quantum efficiency of a backside illuminated image sensor due to the increased reflectivity of the materials over the substrate. Additionally, these materials help to reduce or eliminate damage that may occur due to overetching during processing.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of embodiments of the present invention are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
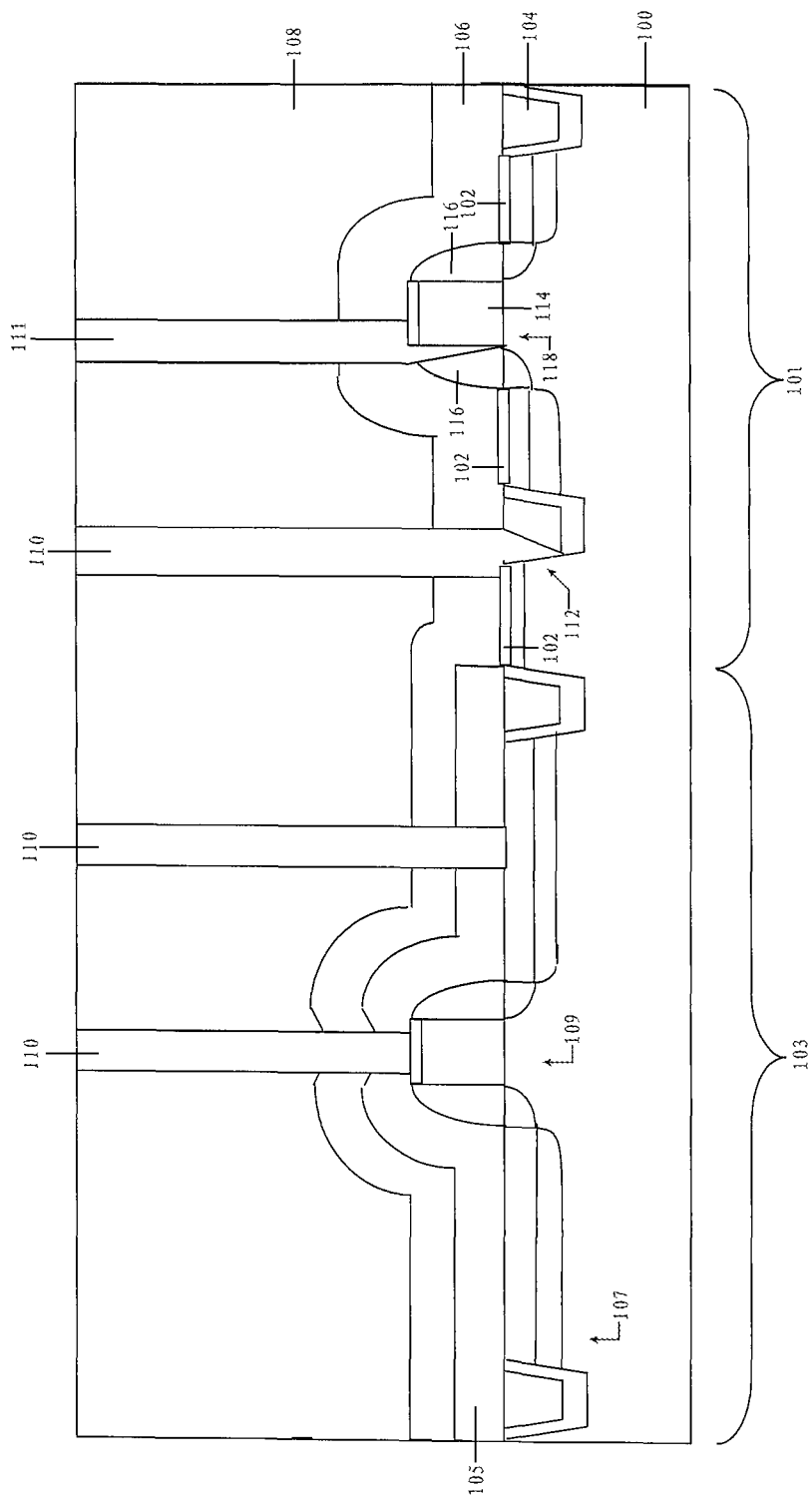
FIG. 1 illustrates defects that may occur in a logic region of an image sensor as known in the prior art.
Figure 2:
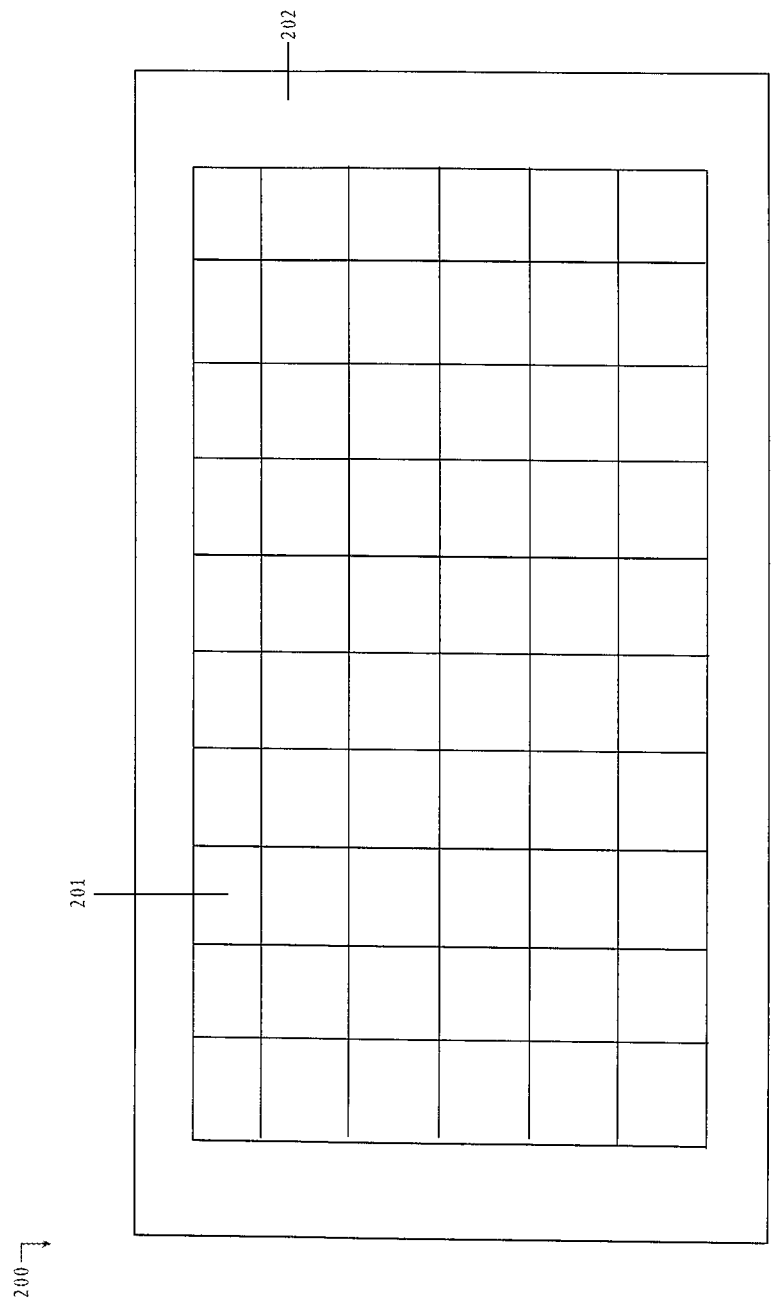
FIG. 2 illustrates an image pixel array region and surrounding logic region of an image sensor in accordance with an embodiment of the present invention.

With reference now to FIG. 2, there is shown an image sensor 200 which comprises a grid or array of backside illuminated pixel regions 201. Each pixel region 201 may comprises a photosensitive diode 313 (not shown in FIG. 2 but illustrated in FIG. 3) which generates a signal related to the intensity or brightness of light that impinges on the photosensitive diode 313.

The image sensor 200 also may comprise a logic region 202 located adjacent to the array of pixel regions 201. The logic region 202 may have additional circuitry and contacts for input and output connections to and from the array of pixel regions 201. The logic region 202 is utilized to provide an operating environment for the pixel regions 201 and to moderate communications between the array of pixel regions 201 and outside devices (not shown).

Figure 3:
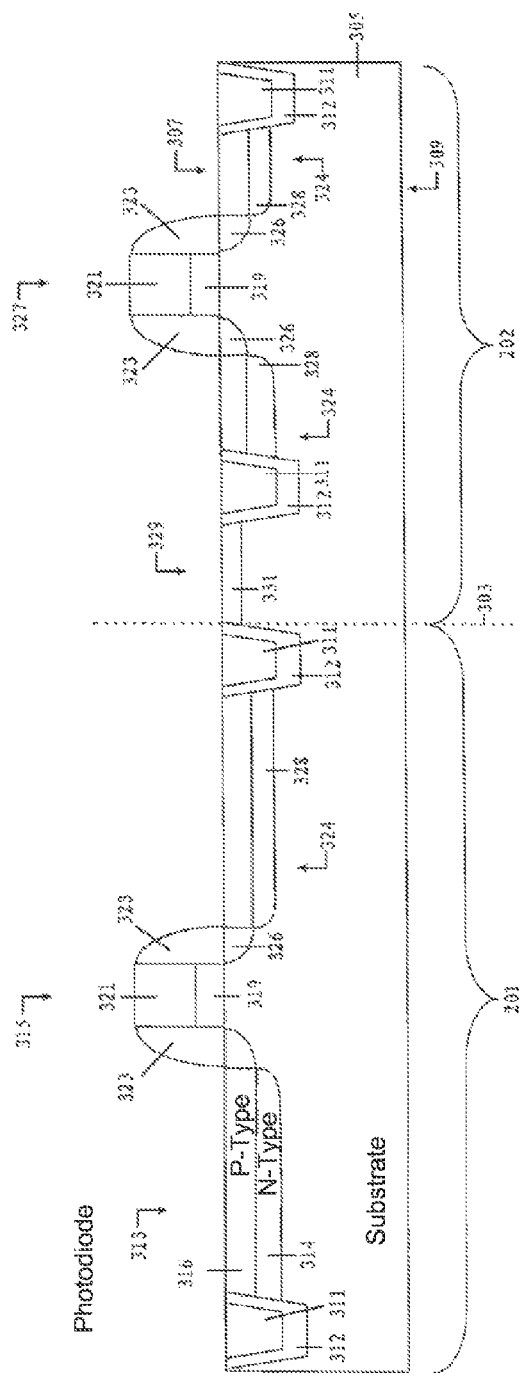
FIGS. 3 through 8 illustrate stages in the manufacture of an image sensor in accordance with an embodiment of the present invention.

FIG. 3 illustrates a simplified cross-sectional view of an individual pixel region 201 and a portion of the logic region 202. Additionally, while pixel region 201 and the logic region 202 may be manufactured adjacent to each other as illustrated by FIG. 3, these regions are merely representative regions of the pixel regions 201 and logic regions 202 formed throughout the image sensor 200. As such, the pixel region 201 and logic region 202 as illustrated in FIG. 3 may also be formed in separate sections of the image sensor, and may not be located adjacent to one another (as illustrated by the dashed line 303).

Both the pixel region 201 and the logic region 202 may be formed on a single substrate 305. The substrate 305 may comprise a front side 307 and a back side 309 and may be a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 305 may comprise a silicon-on-insulator (SOI) substrate. Generally, an SOI substrate comprises a layer of a semiconductor material such as epitaxial silicon, germanium, silicon germanium, SOI, silicon germanium on insulator (SGOI), or combinations thereof. The substrate 305 may be doped with a p-type dopant, such as boron, aluminum, gallium, or the like, although the substrate may alternatively be doped with an n-type dopant, as is known in the art.

The substrate 305 additionally comprises a plurality of isolation structures 311 designed to separate and isolate various devices formed on the substrate 305, and also to separate the pixel region 201 from the logic region 202. The isolation structures 311 may be shallow trench isolations generally formed by etching the substrate 305 to form a trench and filling the trench with dielectric material as is known in the art. The isolation structures 311 may be filled with a dielectric material such as an oxide material, a high-density plasma (HDP) oxide, or the like, formed by conventional methods known in the art. Optionally, an oxide liner 312 may be formed along the sidewalls isolation structures 311.

The pixel region 201 may comprise a photosensitive diode 313 adjacent to a first transistor 315. The photosensitive diode 313 senses the amount of light that impinges the photosensitive diode 313 from the back side 309 of the substrate 305, and may include a pinned layer photodiode. The pinned layer photodiode may comprise an n-type doped region 314 formed in the p-type substrate 305 and also may comprise a heavily doped p-type region 316 (referred to as the pinned layer) formed on the surface of the n-type doped region 314 to form a p-n-p junction. The p-type doped region 316 and heavily doped n-type region 314 may be formed using suitable implantation processes to implant p-type dopants (e.g., boron, gallium, indium, or the like) and n-type dopants (e.g., phosphorous, arsenic, antimony, or the like), as is known in the art.

Further, as one of ordinary skill in the art will recognize, the pinned layer photodiode described above is merely one type of photosensitive diode 313 that may be used in the present invention. For example, a non-pinned layer photodiode may alternatively be used. Any suitable photodiode may be utilized with the present invention, and all of these photodiodes are intended to be included within the scope of the present invention.

The first transistor 315 may be a transfer transistor. However, the first transistor 315 is also merely representative of the many types of functional transistors that may be utilized within the pixel region 201. For example, while the first transistor 315 is illustrated in FIG. 3 as a transfer transistor, embodiments of the invention may also include other transistors located within the pixel region 201, such as a reset transistor, source follower transistor, or a select transistor. These transistors may be arranged to form a four transistor CMOS image sensor (CIS). All suitable transistors and configurations that may be utilized in an image sensor are fully intended to be included within the scope of the present invention.

The first transistor 315 may comprise a gate dielectric 319 adjacent the substrate 305, a gate electrode 321 over the gate dielectric, and spacers 323 along the sidewalls of the gate dielectric 319 and gate electrode 321. Gate dielectric 319 and gate electrode 321 may be formed and patterned on the substrate 305 by any suitable process known in the art. The gate dielectric 319 may be a high-K dielectric material, such as silicon oxide, silicon oxynitride, silicon nitride, an oxide, a nitrogen-containing oxide, aluminum oxide, lanthanum oxide, hafnium oxide, zirconium oxide, hafnium oxynitride, a combination thereof, or the like. The gate dielectric 319 may have a relative permittivity value greater than about 4.

In an embodiment in which the gate dielectric 319 comprises an oxide layer, the gate dielectric 319 may be formed by any oxidation process, such as wet or dry thermal oxidation in an ambient comprising an oxide, $H_2O$, NO, or a combination thereof, or by chemical vapor deposition (CVD) techniques using tetra-ethyl-ortho-silicate (TEOS) and oxygen as a precursor. In one embodiment, the gate dielectric 319 is between about 10 Å to about 150 Å in thickness, such as 100 Å in thickness.

The gate electrode 321 may comprise a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, or a combination thereof. In one example, amorphous silicon is deposited and recrystallized to create poly-crystalline silicon (poly-silicon). In an embodiment in which the gate electrode 321 is poly-silicon, the gate electrode 321 may be formed by depositing doped or undoped poly-silicon by low-pressure chemical vapor deposition (LPCVD) to a thickness in the range of about 100 Å to about 2,500 Å, such as 1,200 Å.

Spacers 323 are formed on the sidewalls of the gate dielectric 319 and the gate electrode 321. The spacers 323 are typically formed by blanket depositing a spacer layer (not shown) on the previously formed structure. The spacer layer may comprise SiN, oxynitride, SiC, SiON, oxide, and the like, and may be formed by commonly used methods such as chemical vapor deposition (CVD), plasma enhanced CVD, sputter, and other methods known in the art. The spacer layer is then patterned to form the spacers 323, such as by anisotropically etching to remove the spacer layer from the horizontal surfaces of the structure.

A source/drain region 324 may be formed in the substrate 305 on an opposing side of the gate dielectric 319 from the photosensitive diode 313. In an embodiment in which the substrate 305 is a p-type substrate, the source/drain region 324 may be formed by implanting appropriate n-type dopants such as phosphorous, arsenic, antimony, or the like. The source/drain region 324 may be implanted using the gate electrode 321 and the spacers 323 as masks to form lightly doped source/drain (LDD) regions 326 and heavily doped source/drain regions 328.

It should be noted that one of ordinary skill in the art will realize that many other processes, steps, or the like may be used to form the source/drain region 324 and the photosensitive diode 313. For example, one of ordinary skill in the art will realize that a plurality of implants may be performed using various combinations of spacers and liners to form the source/drain region 324 and the photosensitive diode 313 having a specific shape or characteristic suitable for a particular purpose. Any of these processes may be used to form the source/drain region 324 and the photosensitive diode 313, and the above description is not meant to limit the present invention to the steps presented above.

The logic region 202 may comprise a second transistor 327 and a contact region 329. The second transistor 327 may also comprises a gate dielectric 319, gate electrode 321, spacers 323, and source/drain regions 324 with LDD regions 326 and highly doped source/drain regions 328. The gate dielectric 319, gate electrode 321, spacers 323, and source/drain regions 324 may be formed of similar materials and in a similar fashion as the first transistor 315, although the second transistor 327 may alternatively be formed of different materials or through separate processes.

The contact region 329 may comprise a region of the substrate 305 that has been doped to form a conductive region 331. The contact region 329 may be a contact to a separate active device (not shown), but may also be a stand alone device such as a resistor. The contact region 329 may be formed through a suitable implantation process similar to the source/drain regions 324 of the second transistor 327, and also may be formed concurrently with the source/drain regions 324 of the second transistor 327. However, other suitable methods of formation may alternatively be utilized.

Figure 4:
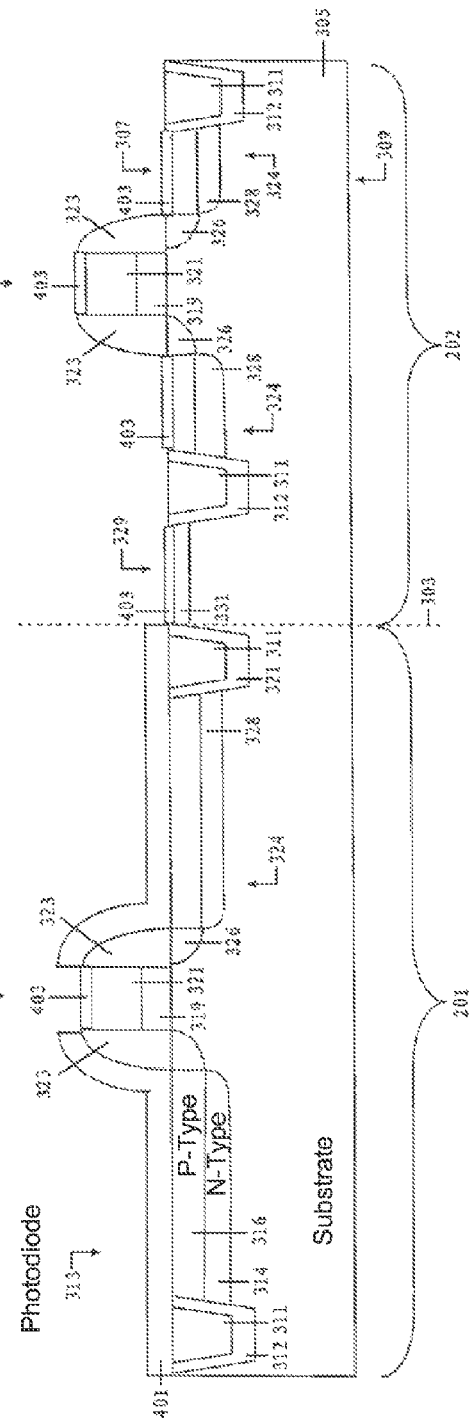

FIG. 4 illustrates the formation and patterning of a first resist protective oxide (RPO) 401 over the pixel region 201 but not over the logic region 202. This may be accomplished by appropriately masking the logic region 202 (e.g., with a photoresistive material) prior to the formation of the first RPO 401. Alternatively, the RPO 401 can be formed through a blanket formation process and then the portion of the blanket RPO over the logic region 202 can be removed using known masking and etching techniques.

The first RPO 401 may comprise an oxide such as silicon oxide, although other suitable materials, such as silicon nitride, silicon oxynitride, combinations of these, and the like, may alternatively be used. The first RPO 401 may be formed using a process such as rapid thermal oxidation, low pressure chemical vapor deposition (LPCVD), or plasma enhanced chemical vapor deposition (PECVD), although any suitable process may be utilized. The first RPO 401 may be formed to a thickness of between about 50 Å and about 800 Å.

Once the first RPO 401 has been formed over the pixel region 201, the first RPO 401 may be patterned to expose the tops of the gate electrode 321 without exposing the surface of the substrate 305. The patterning may be performed using a suitable photolithographic technique, such as the formation of a patterned photoresist followed by a suitable etching. However, any suitable technique to expose the tops of the gate electrodes 321 in the pixel region 201, such as a chemical mechanical polish (CMP), may alternatively be utilized.

Once the top of the gate electrode 321 is exposed, silicide contacts 403 may be formed on the tops of the first transistor 315 and the second transistor 327, and along the exposed substrate 305 in the logic region 202, but not along the covered substrate 305 of the pixel region 201. The silicide contacts 403 are formed from a portion of the surface of the substrate 305 and the gate electrodes 321. The silicide contacts 403 may comprise cobalt, such as, for example, cobalt silicide. However, other commonly used metals, such as titanium, nickel, palladium, platinum, erbium, and the like, can also be used. As is known in the art, the silicidation may be performed by blanket deposition of an appropriate metal layer, followed by an annealing step in which the metal reacts with the underlying exposed silicon. Unreacted metal is then removed, for example, with a selective etch process. The thickness of the silicide contacts 403 may be between about 3 nm and about 50 nm, such as about 10 nm.

Figure 5:
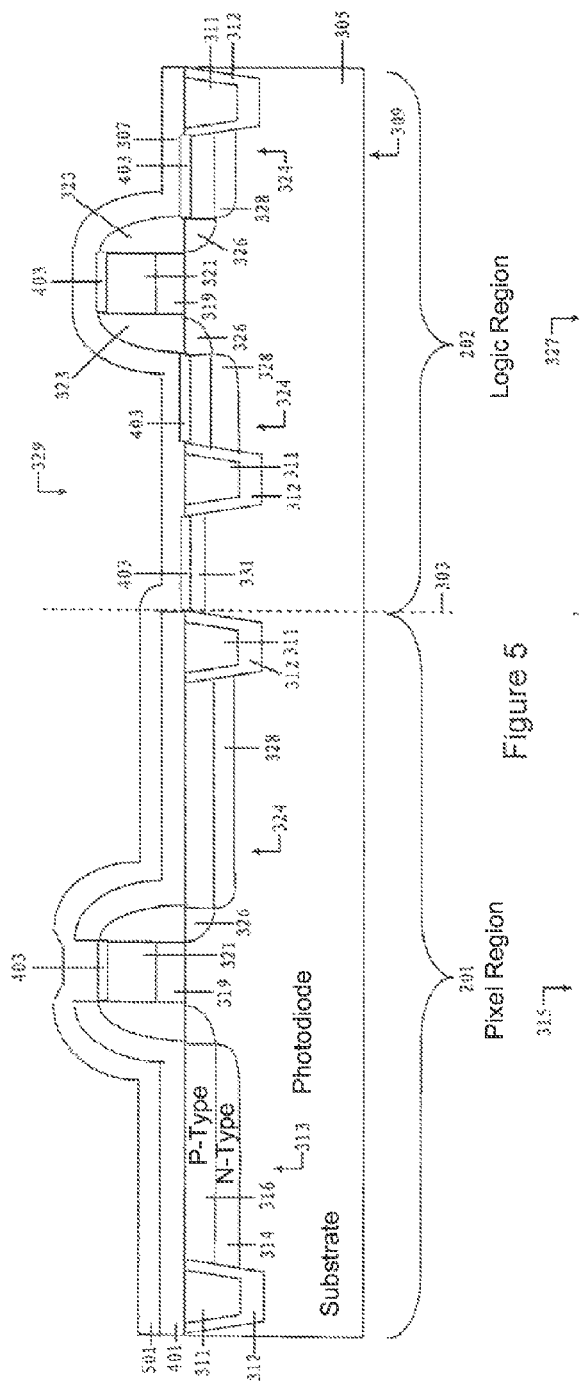

FIG. 5 illustrates the formation of a second RPO 501 over the first RPO 401 and also over the logic region 202. The second RPO 501 may be formed of a similar material as the first RPO 501. Additionally, the second RPO 501 may be formed in the same equipment that formed the metal for the silicide (e.g., cobalt), so as to prevent the unnecessary exposure of the silicide contacts 403 to potentially degrading ambient atmospheres. The second RPO 501 may be formed such that the total thickness of the first RPO 401 and the second RPO 501 in the pixel region 201 is between about 200 Å and about 1,500 Å. Note, however, that because the combined RPO oxide thickness difference between the pixel region and the logic region is relatively small, over etching caused by contact formation (described below with respect to FIG. 8) could be substantially reduced or eliminated.

Figure 6:
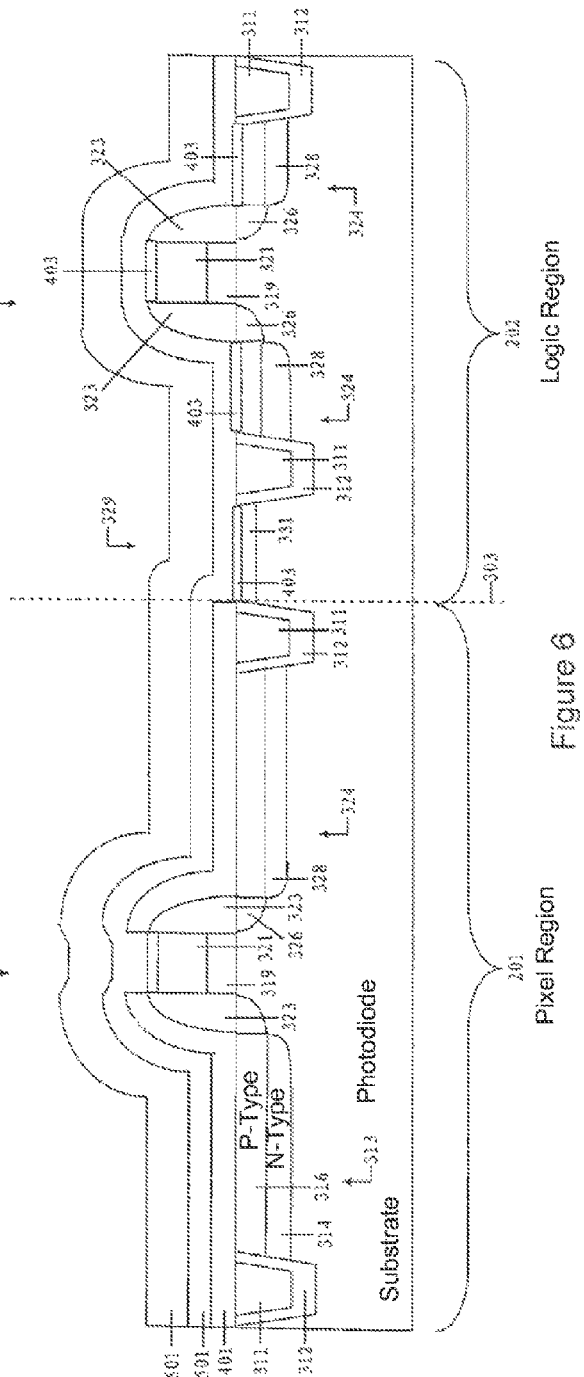

FIG. 6 illustrates the formation of a contact etch stop layer (CESL) 601 over the second RPO 501 in both the pixel region 201 and the logic region 202 to form a dielectric reflector with the first RPO 401 and the second RPO 501. The CESL 601 may be formed of silicon oxynitride, which may also be used to reflect light that is not initially captured by the photosensitive diode 313 back towards the photosensitive diode 313. This enhanced reflectivity increases the overall efficiency of the pixel region 201. However, other materials, such as silicon nitride, nitride, boron nitride, combinations thereof, or the like, may alternatively be used. The CESL 601 may be formed through chemical vapor deposition (CVD) to a thickness of between about 400 Å and about 900 Å

Figure 7:
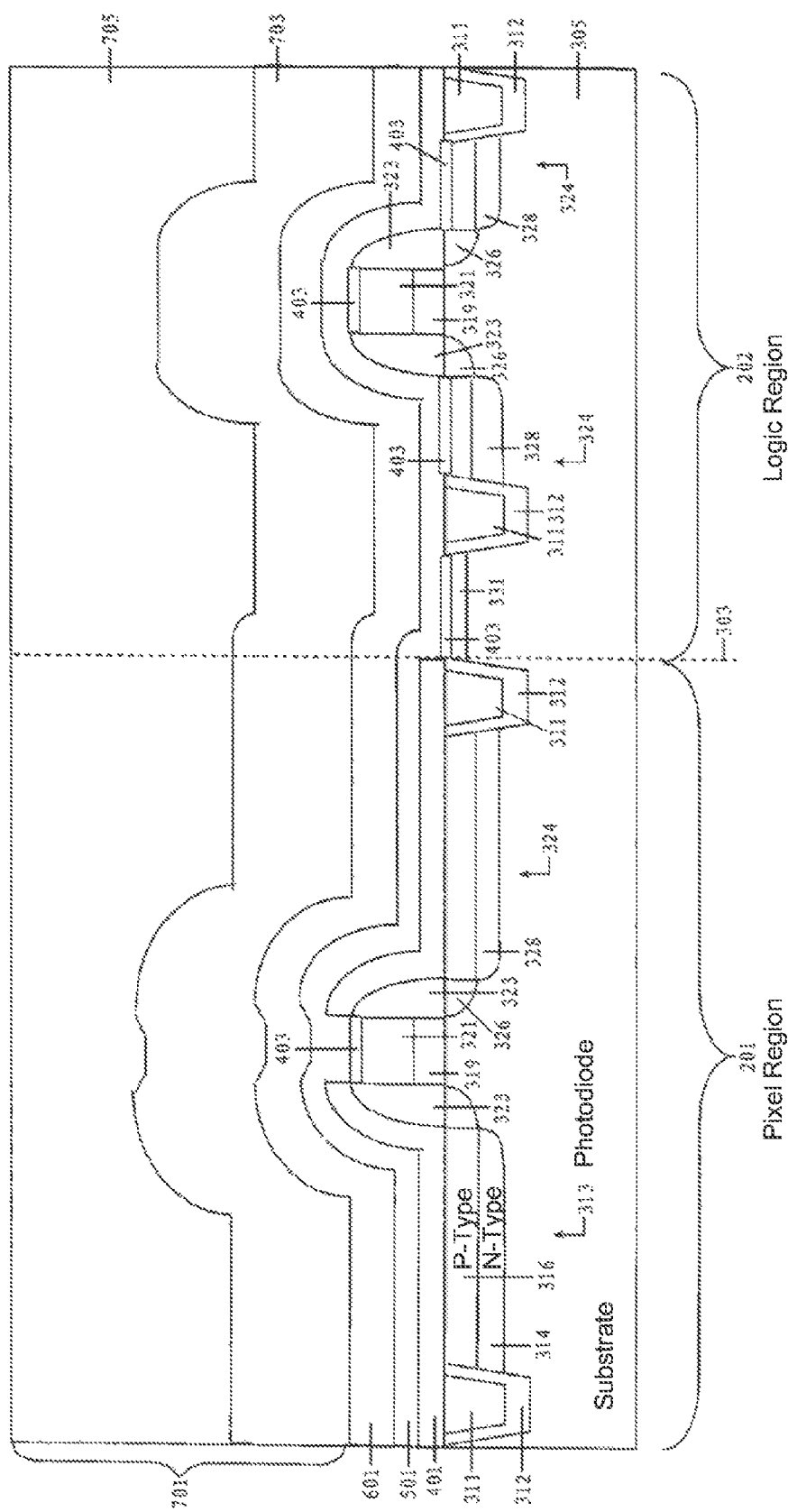

FIG. 7 illustrates the formation of an inter-layer dielectric (ILD) 701 over the CESL 601 and over both the pixel region 201 and the logic region 202. The ILD 701 may be formed of a first ILD layer 703 and a second ILD layer 705. The first ILD layer 703 may comprise a material such as boron phosphorous silicate glass (BPSG) while the second ILD layer 705 may comprise a material such as plasma enhanced tetra-ethyl-ortho-silicate (PE-TEOS), although any suitable dielectrics may be used for either layer. The first ILD layer 703 and the second ILD layer 705 may be formed using a process such as PECVD, although other processes, such as LPCVD, may alternatively be used. The first ILD layer 703 may be formed to a thickness of between about 100 Å and about 3,000 Å, and the second ILD layer 705 may be formed to a thickness of between about 1,000 Å and about 30,000 Å.

Once the first ILD layer 703 and the second ILD layer 705 have been formed, the uneven surface of the second ILD layer 705 may be planarized by a process such as chemical mechanical polishing (CMP) in order to provide a flat, planar surface for further processing steps. However, any suitable planarization process, such as etching, may alternatively be used to planarize the second ILD layer 705.

Figure 8:
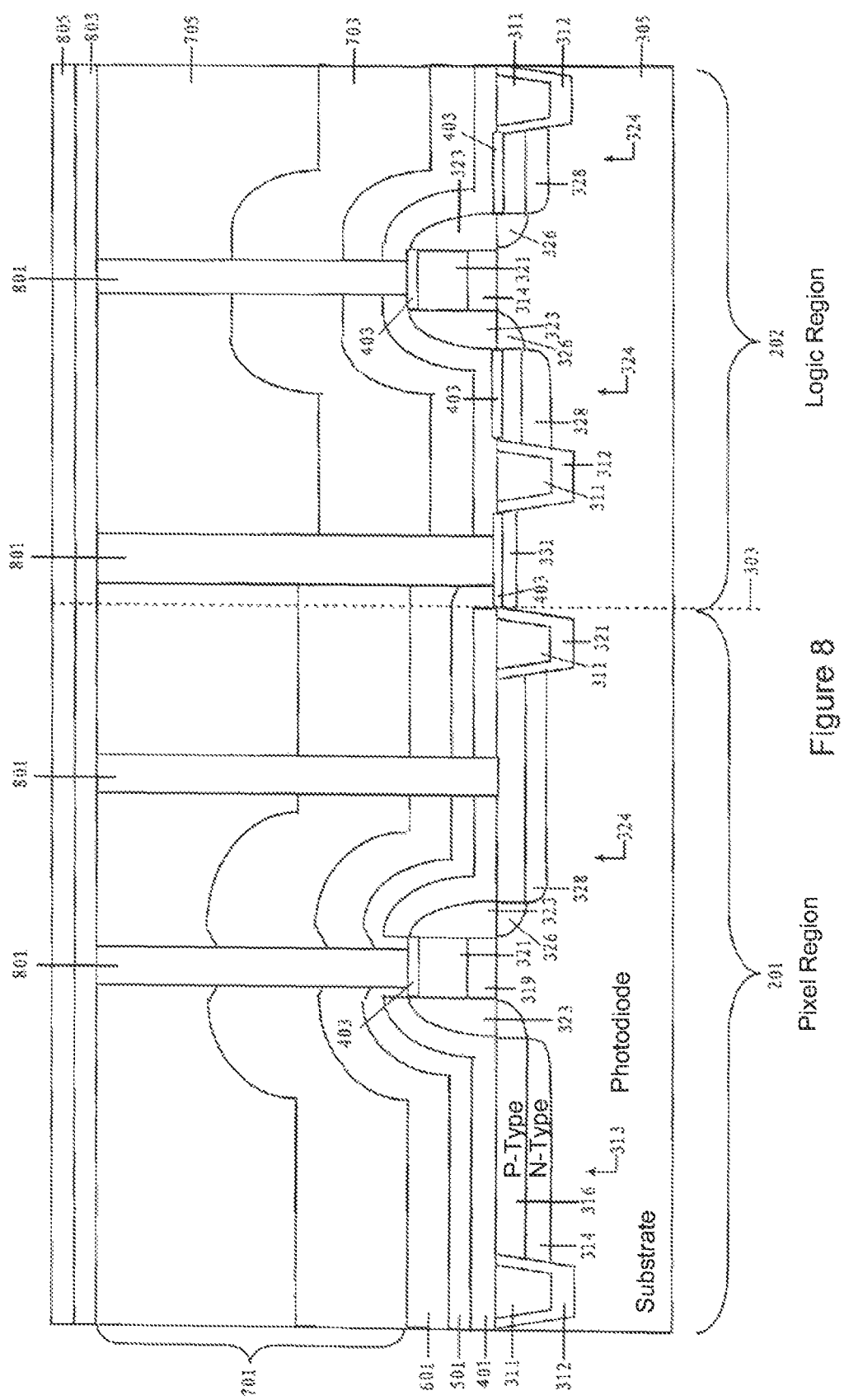

FIG. 8 illustrates the formation of contacts 801 through, from top to bottom, the second ILD layer 705, the first ILD layer 703, the CESL layer 601, the second RPO 501 and, in the pixel region 201, the first RPO 401. Contacts 801 may be formed through the first ILD layer 703, the second ILD layer 705, and down to the CESL 601 in accordance with suitable photolithography and etching techniques. Generally, these photolithography techniques involve depositing a photoresist material, which is masked, exposed, and developed to expose portions of the second ILD layer 705 that are to be removed. The remaining photoresist material protects the underlying material from subsequent processing steps, such as etching. In an embodiment photoresist material is utilized to create a patterned mask to define contacts 801. Additional masks, such as a hardmask, may also be used. The first etching process may be an anisotropic or isotropic etch process.

In an embodiment, the first etching process is continued until at least a portion of the CESL 601 is exposed, but is terminated without significantly removing the CESL 601. A second etch process may then be performed to remove the exposed portions of the CESL 601 and the underlying first RPO 401 and second RPO 501. The second etching process may be continued until the desired silicide regions 403 beneath the first RPO 401 are exposed, but may then be terminated without significantly removing the silicide regions 403. By forming the first RPO 401 and the second RPO 501 as described herein, the likelihood and risks associated with over-etching are minimized or even eliminated as the process window of contact etching remains larger than by simply increasing the overall thickness of an RPO or CESL as attempted in the prior art.

Contacts 801 are then formed so as to contact the exposed silicide regions 403. The contacts 801 may comprise a barrier/adhesion layer (not shown) to prevent diffusion and provide better adhesion for the contacts 801. In an embodiment, the barrier layer is formed of one or more layers of titanium, titanium nitride, tantalum, tantalum nitride, or the like. The barrier layer may be formed through chemical vapor deposition, although other techniques could alternatively be used. The barrier layer may be formed to a combined thickness of about 50 Å to about 500 Å.

The contacts 801 may be formed of any suitable conductive material, such as a highly-conductive, low-resistive metal, elemental metal, transition metal, or the like. In an exemplary embodiment the contacts 801 are formed of tungsten, although other materials, such as copper, could alternatively be utilized. In an embodiment in which the contacts 801 are formed of tungsten, the contacts 801 may be deposited by CVD techniques known in the art, although any method of formation could alternatively be used.

After the contacts 801 are formed, further processing of the front side 307 of the substrate 305 may be performed. This processing may comprise forming various conductive and dielectric layers (collectively referred to by the reference number 803) in order to form interconnections between the individually formed devices (e.g., the first transistor 315 and the second transistor 327) to each other. These interconnections may be made through any suitable formation process (e.g., lithography with etching, damascene, dual damascene, or the like) and may be formed using suitable conductive materials such as aluminum alloys, copper alloys, or the like.

Additionally, once the interconnections have been formed over the conductive and dielectric layer, a passivation layer 805 may be formed in order to protect the layers from physical and chemical damage. The passivation layer 805 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The passivation layer 805 may be formed through a process such as chemical vapor deposition (CVD), although any suitable process may be utilized.

After processing of the front side 307 of the substrate 305 has been completed, the thickness of the back side 309 of the substrate 305 may reduced, or thinned. Thinning reduces the distance that light travels through the back side 309 of the substrate 305 before it reaches the photosensitive diode 313. The thinning of the back side 309 of the substrate 305 may be performed using a removal process such as chemical mechanical polishing (CMP). In a CMP process, a combination of etching materials and abrading materials are put into contact with the back side 309 of the substrate 305 and a grinding pad (not shown) is used to grind away the back side 309 of the substrate 305 until a desired thickness is achieved. However, any suitable process for thinning the back side 309 of the substrate 305, such as etching or a combination of CMP and etching, may alternatively be used. The back side 309 of the substrate 305 may be thinned to have a thickness of between about 1 µm and about 6 µm.

Figure 9A:
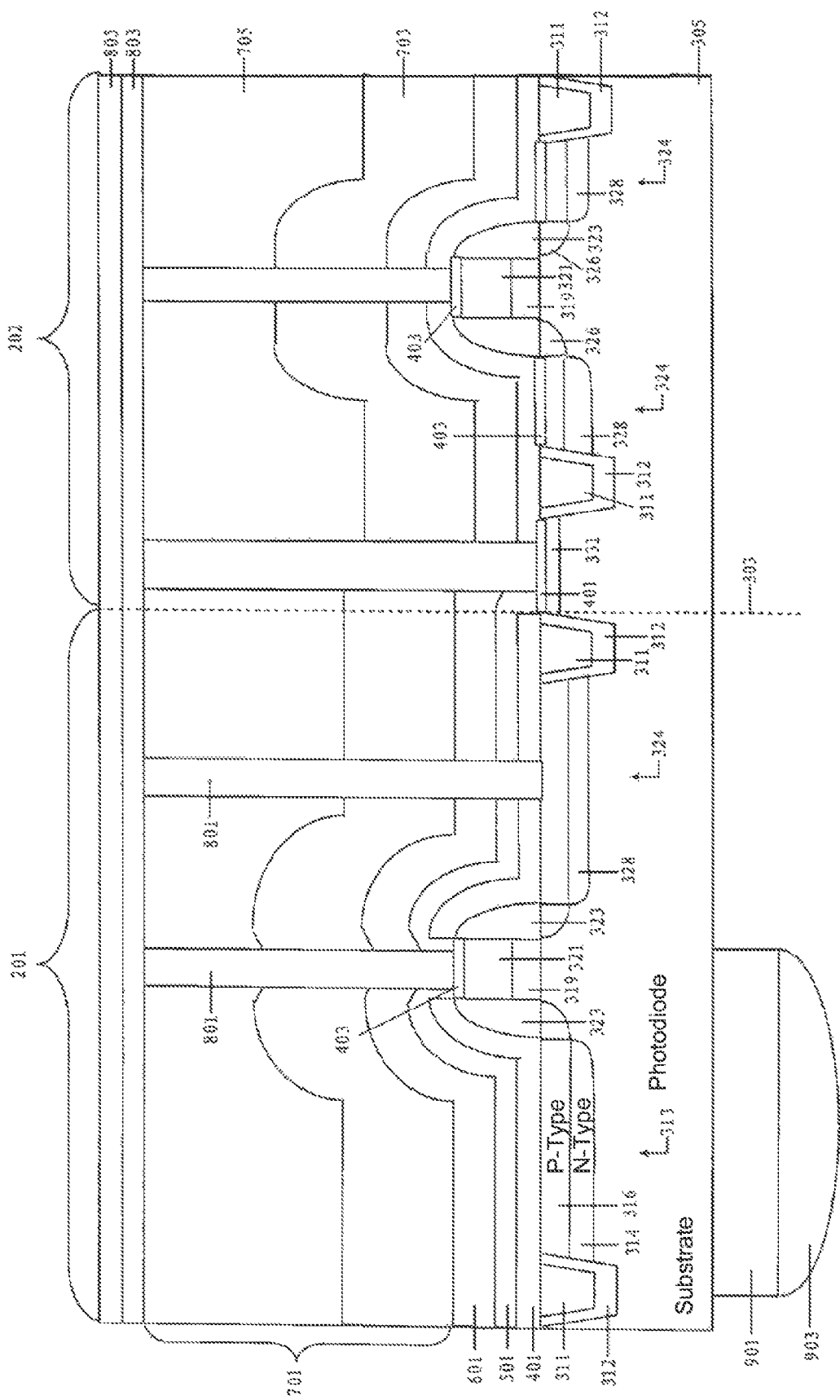
FIG. 9A illustrates the formation of a microlens and color filter over the pixel region in accordance with an embodiment of the present invention.

FIG. 9A illustrates the formation of a first color filter 901 and a microlens 903 on the back side 309 of the substrate 305. The first color filter 901 may comprise a filter for one of the primary colors (e.g., red, green, blue) and may be positioned to filter the light that will impinge upon the photosensitive diode 313. The first color filter 901 may comprise a polymeric material or resin, such as a polymeric polymer, which includes colored pigments.

The microlens 903 may be formed opposite the first color filter 901 from the substrate 305, and may be used to focus impinging light more directly onto the photosensitive diode 313. The microlens 903 may be formed by first applying and patterning a positive type photoresist (not shown) over the first color filter 901. Once formed, the patterned photoresist may then be baked to round the photoresist into the curved microlens 903.

Figure 9B:
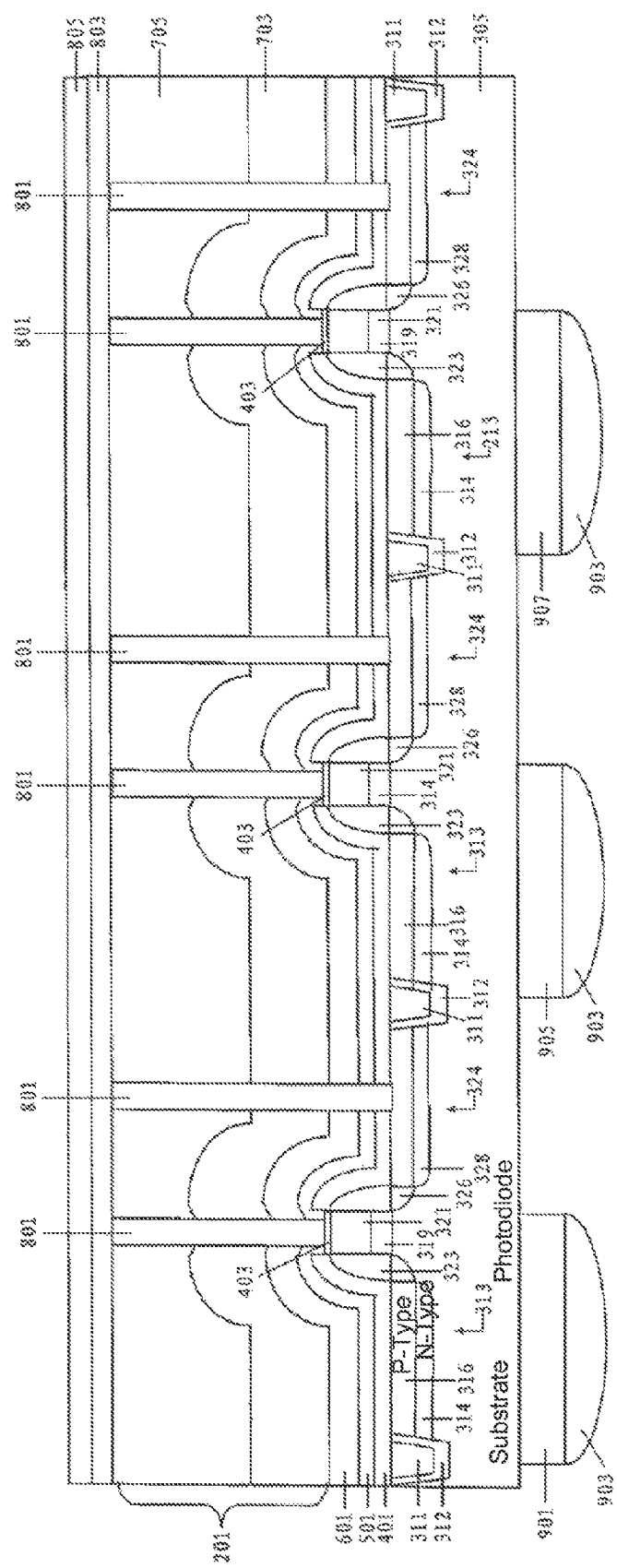
FIG. 9B illustrates another view of the pixel region which has three separate color filters over three separate photosensitive diodes in accordance with an embodiment of the present invention.

FIG. 9B illustrates another view of the pixel region 201 which shows not only the photosensitive diode 313 as described above with respect to FIGS. 3-8, but an additional two photosensitive diodes 313 and their respective transfer transistors 315. Further, while the first color filter 901 filters one photosensitive diode 313, a second color filter 905 filters light to another photosensitive diode 313 and a third color filter 907 filters light to another photosensitive diode 313. In this configuration, the first color filter 901, the second color filter 905, and the third color filter 907 may each filter a different color, such as the first color filter 901 being a red filter, the second color filter 905 being a blue filter, and the third color filter 907 being a green filter. By having the first color filter 901, the second color filter 905, and the third color filter 907 filter different colors of light, the image sensor can better capture color images.

Although the present invention and its advantages have been described in detail, it should be understood that various changes, substitutions and alterations can be made herein without departing from the spirit and scope of the invention as defined by the appended claims. For example, charge coupled devices (CCD) may be utilized in place of the CMOS devices within the image sensor, different materials may be utilized for the silicide contacts, or different methods of formation may be utilized for the various layers of material. These devices, steps and materials may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A backside illuminated image sensor comprising:
    a substrate with a pixel region and a logic region, the substrate comprising a first side and a second side opposite the first side, the logic region providing input and output connections to the pixel region;
    a first active device in the pixel region, wherein the first active device is at least partially located on the first side of the substrate and wherein the first active device comprises a photosensitive element positioned to receive light from the second side of the substrate;
    a second active device in the logic region at least partially located on the first side of the substrate;
    a first protective layer over the first side of the substrate in the pixel region, wherein the logic region is free from the first protective layer;
    a second protective layer over the logic region and the first protective layer in the pixel region; and
    a contact etch stop layer over the second protective layer, wherein the first protective Layer, the second protective layer, and the contact etch stop layer form a dielectric reflector Located to reflect light to the photosensitive element.

2. The backside illuminated image sensor of claim 1, further comprising:
    a first silicide contact formed on a top surface of the first active device, wherein a major surface of the substrate located in the pixel region is free from silicide; and
    a second silicide contact formed on the major surface of the substrate in the logic region.

3. The backside illuminated image sensor of claim 2, wherein the first silicide contact is substantially free of the first protective layer.

4. The backside illuminated image sensor of claim 1, wherein the contact etch stop layer comprises silicon oxynitride.

5. The backside illuminated image sensor of claim 1, wherein a combined thickness of the first protective layer and the second protective layer is between about 200 Å and about 1,500 Å.

6. The backside illuminated image sensor of claim 1, further comprising a plurality of color filters in the pixel region.

7. The backside illuminated image sensor of claim 1, further comprising a plurality of microlenses in the pixel region.

8. The backside illuminated image sensor of claim 1, wherein a thickness of the substrate is between about 1 μm and about 6 μm.

9. An image sensor comprising:
a substrate with a pixel region and a logic region, the logic region surrounding the pixel region;
a first device located at least partially on a first surface of the substrate in the pixel region, wherein the first device is located to receive light from a second surface of the substrate opposite the first surface;
a second device in the logic region located on the first surface of the substrate;
a first metal-containing layer located on the first device, wherein the first metal-containing layer is a silicide contact that extends across a gate electrode;
a second metal-containing layer located on a major surface of the substrate in the logic region, wherein a major surface of the substrate adjacent to the first device is free of metal;
a first protective layer located over the pixel region without covering the first metal-containing layer, wherein the logic region is free from the first protective layer;
a second protective layer located over the pixel region and the logic region; and
a contact etch stop layer over the second protective layer, wherein the contact etch stop layer is part of a dielectric reflector adjacent to the first device, the dielectric reflector further comprising the first protective layer and the second protective layer.

10. The image sensor of claim 9, wherein the contact etch stop layer is silicon oxynitride.

11. The image sensor of claim 9, wherein the metal-containing layer comprises a cobalt silicide.

12. The image sensor of claim 8, wherein the substrate has a thickness between about 1 μm and about 6 μm.

13. The image sensor of claim 9, wherein the contact etch stop layer has a thickness between about 400 Å and about 900 Å.

14. The image sensor of claim 9, wherein a combined thickness of the first protective layer and the second protective layer is between about 200 Å and about 1,500 Å.

15. The image sensor of claim 9, further comprising a color filter and a microlens located on the second surface of the substrate in the pixel region.

16. A method for manufacturing a backside illuminated image sensor, the method comprising:
providing a substrate, the substrate comprising a first region and a second region, the first region being a pixel region and the second region being a logic region moderating communications for the pixel region;
forming a first device in the first region, the first device being located on a first surface of the substrate and positioned to receive light from a second surface of the substrate opposite the first surface;
forming a second device in the second region;
forming a first protective layer so as to be located over the first region without being located over the second region;
exposing a top surface of the first device without exposing a major surface of the substrate in the first region;
forming a first silicide region on the top surface of the first device;
forming a second silicide region on the major surface of the substrate in the second region;
forming a second protective layer over the first region and the second region; and
forming a contact etch stop layer over the second protective layer, wherein the first protective layer, the second protective layer, and the contact etch stop layer are dielectric layers positioned to reflect light to the first device.

17. The method of claim 16, further comprising forming microlenses on the second surface of the substrate.

18. The method of claim 16, further comprising:
forming an interlayer dielectric over the contact etch stop layer; and
forming contacts to the first device and the second device through the interlayer dielectric, the contact etch stop layer, the second protective layer, and the first protective layer.

19. The method of claim 16, wherein both the first protective layer and the second protective layer are silicon oxide formed by PECVD.

20. The method of claim 16, wherein the forming the first silicide region and the forming the second protective layer are performed in the same process chamber.

* * * * *